United States Patent
Lassa et al.

(10) Patent No.: US 8,102,062 B1
(45) Date of Patent: Jan. 24, 2012

(54) OPTIONALLY BONDING EITHER TWO SIDES OR MORE SIDES OF INTEGRATED CIRCUITS

(75) Inventors: Paul A. Lassa, Mountain View, CA (US); Paul C. Paternoster, Los Altos, CA (US); Po-Shen Lai, San Jose, CA (US)

(73) Assignee: SanDisk Technologies Inc., Plano, TX (US)

( * ) Notice: Subject to any disclaimer, the term of this patent is extended or adjusted under 35 U.S.C. 154(b) by 729 days.

(21) Appl. No.: 11/966,012

(22) Filed: Dec. 28, 2007

(51) Int. Cl.
*H01L 23/52* (2006.01)
*H01L 23/48* (2006.01)
*H01L 29/40* (2006.01)

(52) U.S. Cl. .............. 257/786; 257/E23.07; 257/778; 257/780; 257/781; 438/612

(58) Field of Classification Search ............ 257/E23.07, 257/E23.043, E23.176, E25.013, 690, 778–781, 257/784, 786; 438/612, 614, 617, 666
See application file for complete search history.

(56) References Cited

U.S. PATENT DOCUMENTS

| | | | | |
|---|---|---|---|---|
| 5,506,499 A * | 4/1996 | Puar | ..................... | 324/754.03 |
| 5,986,957 A * | 11/1999 | Ishii | ..................... | 365/94 |
| 6,320,757 B1 * | 11/2001 | Liu | ..................... | 361/760 |
| 6,580,164 B1 * | 6/2003 | Ohie | ..................... | 257/690 |
| 6,586,823 B2 * | 7/2003 | Ohmura et al. | ..................... | 257/678 |
| 6,791,127 B2 * | 9/2004 | Nunokawa | ..................... | 257/203 |
| 6,807,109 B2 * | 10/2004 | Tomishima | ..................... | 365/189.05 |
| 6,882,171 B2 * | 4/2005 | Ong | ..................... | 324/750.3 |
| 6,891,275 B2 * | 5/2005 | Lane et al. | ..................... | 257/786 |
| 7,081,899 B2 * | 7/2006 | Shimazaki et al. | ..................... | 345/590 |
| 7,489,023 B2 * | 2/2009 | Pape | ..................... | 257/666 |
| 7,541,680 B2 * | 6/2009 | Kwon et al. | ..................... | 257/777 |
| 7,579,683 B1 * | 8/2009 | Falik et al. | ..................... | 257/690 |
| 7,598,606 B2 * | 10/2009 | Chow et al. | ..................... | 257/686 |
| 7,608,925 B2 * | 10/2009 | Takinomi | ..................... | 257/724 |
| 7,664,895 B2 * | 2/2010 | Nonoyama et al. | ..................... | 710/71 |
| 2002/0121679 A1 * | 9/2002 | Bazarjani et al. | ..................... | 257/666 |

* cited by examiner

*Primary Examiner* — Chris Chu (74) *Attorney, Agent, or Firm* — Brinks Hofer Gilson & Lione (57) ABSTRACT

Methods and systems for forming a variety of integrated circuits, having quite different interfaces and packages, from a single manufactured die. Preferably the die has bond pads for at least a first mode of operation positioned along only two of its four sides, and these bond pads are sufficient to construct a multi-chip module in which the die is functional in the first mode of operation. Many of the pads on these two sides are duplicated on third and/or fourth sides, except that power management circuitry prevents wasteful capacitive current onto whichever of the duplicated pads is not connected out. Optionally the third and/or fourth sides can be used for connections needed for a mode which is not available with two sides only.

20 Claims, 8 Drawing Sheets

OPTIONALLY BONDING EITHER TWO SIDES OR MORE SIDES OF INTEGRATED CIRCUITS

BACKGROUND

The present application relates to integrated circuits, modules, and packaging and connection methods for them; and more particularly to multi-chip modules, and to optional use of a single integrated circuit in either a standalone package or a multi-chip module.

Previous solutions for a controller to support both two-adjacent-sided SIP bonding and a low cost discrete package (such as four-sided QFP) would involve choosing a larger QFP with pin-count=2×(pad count), where only two sides are bonded, and pins on sides 3 and 4 are wasted and not used. In addition to increased package cost, the larger package may violate mechanical size requirements.

An alternative package, a BGA (Ball-Grid-Array) achieves support for both the SIP configuration and discrete controller packaging and allows (pin-count)=(pad-count) with pads only on two-sides, and satisfies the mechanical size requirements. However, the BGA package requires an internal substrate/RDL that makes it significantly more expensive than the four-sided QFP mentioned above.

Mechanical and Cost Factors in Die Packaging

Chip die packaging is commonly selected to minimize cost and/or mechanical footprint. The ultimate minimal limit of one of these two usually comes at the expense of the other. The smallest mechanical package for a given die is usually the most expensive packaging technology, and the least expensive packaging substrate/RDL technology for a given die-size typically does not offer the minimum mechanical footprint.

Two common package types can illustrate this for a given design, the BGA (ball grid array) and the QFP (quad flat pack). For an 80 pad design, a BGA device footprint is 9 rows of 9 balls. For the equivalent design in a QFP, the device footprint would be four sides at 20 pins per side. In prior art available packaging technology, with equivalent surface-mount manufacturing tolerances, the BGA can achieve a smaller device footprint for the same 80 pads needed. However, the BGA is a more costly solution which employs, in addition to bond wires, an internal substrate to re-route the die's two or four sides of in-line pads to a closely packed 9×9 array of balls. This embedded substrate adds significant cost to the BGA package assembly, while a QFP largely consists of only an inexpensive lead frame and bond wires. In high volume consumer-level products, this package cost difference can significantly impact product margin, and subsequently, the financial success of the product.

QFP packaging needs fairly homogeneous pinout densities if it is to maximize cost-effectiveness. For example, if 80 pins must be brought out, a QFP80 is much cheaper than a QFP160; however, use of a QFP80 requires that exactly 20 pins per side must be used. Thus if the system configuration dictates that 30 pins must be used on one particular side, a QFP80 cannot be used.

Mechanical Assembly: Discrete Memory+Controller Packaging Vs. SIP

There are two main approaches to die/product packaging for industry-standard Host-based Nonvolatile electronic storage devices (Flash storage cards or Flash drives):

1. Discrete—Memory and Controller are packaged discretely and are then soldered to a PC board/substrate along with interface connector (e.g. USB) and needed support circuitry (resistors, capacitors, inductors, etc.).

2. SIP (System-in-package)—Memory and Controller dies stacked on a substrate with card edge connector—with only bond wire interconnects, and limited support circuitry (resistors, capacitors, inductors, etc.)—Assembly is then molded in plastic.

Pad-Limited Vs. Core-Limited

Another major factor in package selection is whether the design is pad-limited or core-limited. In a pad-limited design, the minimum die-size possible is dictated by the arrangement of pads around a smaller logic core—more logic could fit without growing the die-size. In a core-limited design, the minimum die size possible is dominated by the logic core dimensions—extra pads could fit without growing the die-size.

The most efficient/cost-effective of these two is core-limited. Pad-limited designs are considered to "waste" silicon with un-used/blank logic area. The final die area (length and width) of pad-limited design is dictated by the (number of pads)×(pad width) for the two dimensional edges of the design.

Similarly, since pads have a set depth dimension (measured from edge of die to edge of internal core), a core-limited design could potentially waste perimeter die area (pad ring) if the pads are placed on three or four sides, when they might have all fit on just one or two sides. The final die area (length and width) of a core-limited design is dictated by the two dimensional edges of the core logic+(# of sides of die that require pads)×(pad depth)×(length of that side of die). An exception to this is the use of a physical design method of circuit under pad (CUP) that allows the pad ring to overlay the perimeter of the logic area rather than abut it. CUP is a relatively new method, and requires several other design considerations that limit its broad applicability.

Ultimately, these pad arrangements (pad packing, pad reduction, and pad placement methods) and packaging technology decisions will impact the overall die-size and cost of the design. Knowing this, certain mechanical and electrical approaches and methods can be exploited to minimize overall system cost in a potentially die-size neutral way.

Two-Sided vs. Four-Sided

Typically, a chip design team would select either a two-sided OR a four-sided pad arrangement for a die that would require a bonded package. If both were needed, two separate die may be designed where each one used the optimal pad selection and arrangement to minimize die and package cost. Alternatively, the minimum number of pads to accommodate both packages could be used, but a costly RDL would be needed to minimally distribute the two sides of pads to a four-sided package, due to the length limitation on bond wires.

Two-sided (L-shaped) die bonding is the preferred arrangement for a memory controller die that is to be assembled in a SIP packaging scheme where it is stacked atop a larger memory die (that dictates the maximum package size) and connected with bond wires to common pads on the memory die via a shared substrate. When the controller is much smaller than the memory device, only pads on two sides of the controller can effectively reach the shared substrate through mechanical-length-limited bond wires.

Four-sided (full square or rectangle) die bonding is the preferred arrangement for low-cost QFP packaging when just the controller is assembled in a single package (no memory or substrate stacking). When lowest cost and smallest mechanical footprint are key design goals, the minimum number of pins per side in a QFP can offer the optimal configuration.

Typically, the total number of required pads are near equally distributed across the four sides (Ex: ~80 total pads→20 pads per side of four-sides).

The two-sided arrangement is fundamentally at odds with the four-sided arrangement, since the same 80 pads noted above would typically need to be split up to ~40 per side of two sides (L-shaped). Without further handling, this 40-per side L-shape (with no pads on sides 3 and 4) would then require a 160-pin QFP if it were to simultaneously support both two-sided and four-sided package bonding (2 sides, 80 pins, would be unused/wasted in the QFP). Either this higher pin-count (only two sides bonded) QFP package costs more than a lower pin-count (four-sides bonded) QFP, or it is mechanically larger than a (four-sides bonded) QFP, or both. The 40 per side QFP would thus add unnecessary cost, or possibly exceed the mechanical form factor, or both.

If such a dual-purpose (dual package-bonding-capable—both SIP and QFP) die were needed (e.g. to cost-effectively support a plurality of on-board data interfaces that serve multiple package and product configurations), then certain considerations would need to be addressed to provide optimal pad, power, and functional configurations where both cost and mechanical package size were minimized simultaneously for the multiple configurations.

SUMMARY

The present application, in various embodiments, discloses new ways to provide multipackage compatibility (preferably including both multi-chip and single-chip options) while still preserving extremely low power consumption. In various embodiments, this is accomplished by providing pads for different mutually incompatible packages on the chip.

The present application provides methods for a single controller die to mechanically, functionally, and electrically support both a two-adjacent-sided configuration (for "SIP," or system-In-Package) and also a low-cost discrete package configuration (such as "QFP," or Quad Flat Pack, which used four-sided bonding) in a minimal mechanical footprint without employing a costly RDL (Re-Distribution Layer). This results in cost-effective support for a plurality of on-board data interfaces that serve different package and mode configurations.

Preferably (in some embodiments, but not necessarily all), some pads are duplicated on different sides of the chip, so that the chip can be configured for connections on two sides or four sides. Preferably not all pads are duplicated, but only a subset.

In some embodiments (but not necessarily all), the pads which are unused in a given configuration are powered down (or held in a minimum-power configuration), to maximize power efficiency. This is a synergistic improvement on conventional power island architectures, since the replicated pads can be regarded as elements of separate pad domains. Thus in this class of embodiments, quasi-static selection of the host interface module is extended with quasi-static selection of the appropriate pad domain, so that appropriate connections are used for the actual input/output configuration without excess power consumption.

In a further class of embodiments, some of the controller chip's configuration modes may themselves be multi-capable. For just one example, in the presently preferred embodiment, the controller chip can be bonded in a two-edge configuration which preserves both USB and SD configuration. The controller chip responds to external voltages by operating in the appropriate mode. However, the same controller chip can also be bonded out in a four-sided configuration to provide a simple one-chip package, as described above.

The disclosed inventions, in various embodiments, provide one or more of at least the following advantages:

Flexible manufacturing.

Versatile inventory, since manufactured chips can be packaged in different ways, and/or targeted at completely different products.

Compatibility of chips with multiple market segments.

Low power consumption.

Adaptability to new packaging designs.

Adaptability to custom packaging requirements from large customers.

Optimal packaging choice.

Controller chip qualification is less expensive, since only one controller chip version needs to be qualified.

Complete functionally identical modules can be assembled either from naked dice or packaged memory chips, depending on availability.

Improved time to market, especially in new products which can use an existing controller chip or design.

BRIEF DESCRIPTION OF THE DRAWINGS

The disclosed inventions will be described with reference to the accompanying drawings, which show important sample embodiments of the inventions and which are incorporated in the specification hereof by reference, wherein:

FIGS. 1B-1, 1B-2 and 1B-3 together show a power island diagram of the integrated circuit of FIG. 1A;

DETAILED DESCRIPTION OF THE PREFERRED EMBODIMENTS

The numerous innovative teachings of the present application will be described with particular reference to presently preferred embodiments (by way of example, and not of limitation).

The preferred embodiment will be described in the context of a chip informally designated as "Tripoli," and much of the following discussion will refer to the Tripoli chip. However, this is merely an example of a chip design which advantageously uses various disclosed inventions, and the particulars of this chip are not necessary to the claimed inventions. As used herein, it is only a generic designation for a chip using the inventions. Indeed it is expected that the various disclosed inventions can be applied to a wide range of chip designs, especially (but not only) to memory controllers, and even more especially (but not only) to controllers for secure, low-power nonvolatile memory.

It is not intended that this Tripoli designation refers to any produced chip, but it is possible that future chip designs may also be named Tripoli. This description does not necessarily correspond to any particular chip found on the market in future years.

Packaging Support

The Tripoli chip provides control logic to configure pad ring for several product packaging configurations. The choices in packaging (Controller, Controller+Memory, etc.) are dictated by three main factors:

Cost

Form-factor

Memory support (packaged vs. bare-die, and technology node)

In many cases, these are interrelated. The lowest cost solution is always desired for the form-factor required, and the form-factor often dictates what memory can be used.

SIP (System-In-Package)

Further considerations are needed when a controller must interface with a bare-die memory in a stacked controller-on memory-on substrate arrangement, referred to as SIP (System-In-Package). In this case, bond wires must reach from controller die pads to substrate, and NAND memory die pads to substrate. The location of both sets of these pads/bond wires impacts the size and complexity (layers), and thus cost of the substrate. Therefore, placement and ordering of the controller pads must be coordinated with the pad locations on the NAND memories to be supported by Tripoli. Many chip design typically have a rectangular shape (short and long sides), but the location of the pads is not the same among the different technology nodes (130, 90, 70, or 55 nm).

Figure 1:
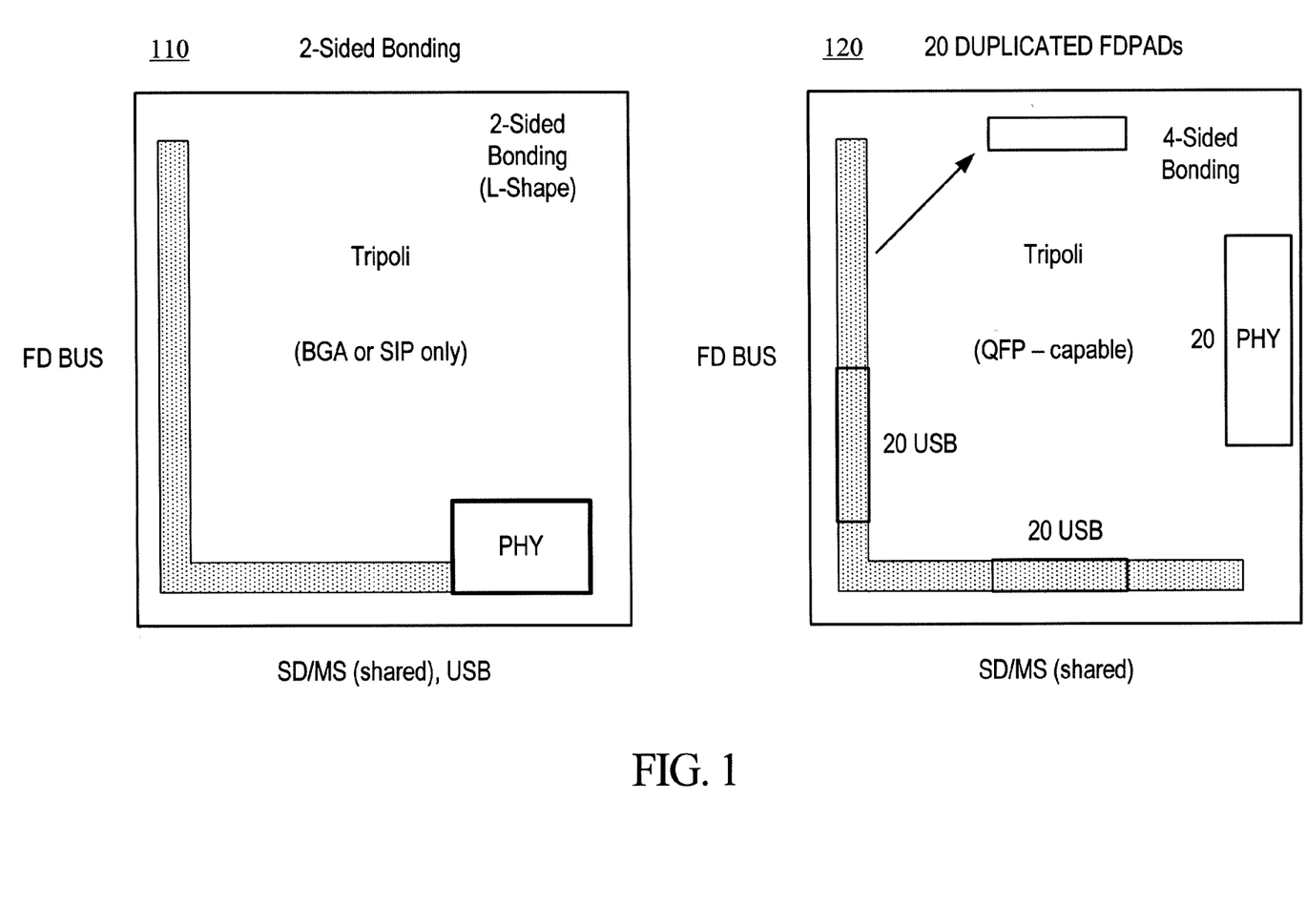
FIG. 1 is a two-part figure, showing two sets of bonding connections which can be activated in two different modes of the same chip, for use with different package configurations.

FIG. 1 illustrates two possible arrangements of the Tripoli I/O pads that could be used to achieve all product configuration requirements: two-sided (L-shaped) bonding 110 and four-sided bonding 120. The two-sided bonding option 110 has been used on several prior art embodiment controllers to allow stacking a controller on top of a bare-die (unpackaged) flash memory device (much larger) in the lower left corner, then stacking both on a substrate. Bond wires are then run from the left side of the controller (i.e. the FD bus) to the substrate, and from the left side of the flash memory to the substrate, where they are electrically connected. A second set of bond wires are run from the bottom side of the controller (SD/MMC/MS Host bus) to the substrate, where the needed host bus and power connections are run to the card edge connector.

The four-sided bonding 120 has also been used on several prior art embodiment controllers to allow packaging in cost-effective Quad Flat Pack (QFP) packages. The most efficient use of the QFP is to minimize and equally distribute pad-to-pin connections on all four sides of the controller. The package is then assembled on another substrate or PCB to connect to packaged flash memory. The four-Sided Bonding 110 was also selected to simultaneously provide the two-sided bonding required for SIP (bare-die memory), and the 20-per-side bonding required for the low-cost USB 80 QFP package (Packaged memory).

Exemplary Integrated Circuit—Tripoli

Figure 1A:
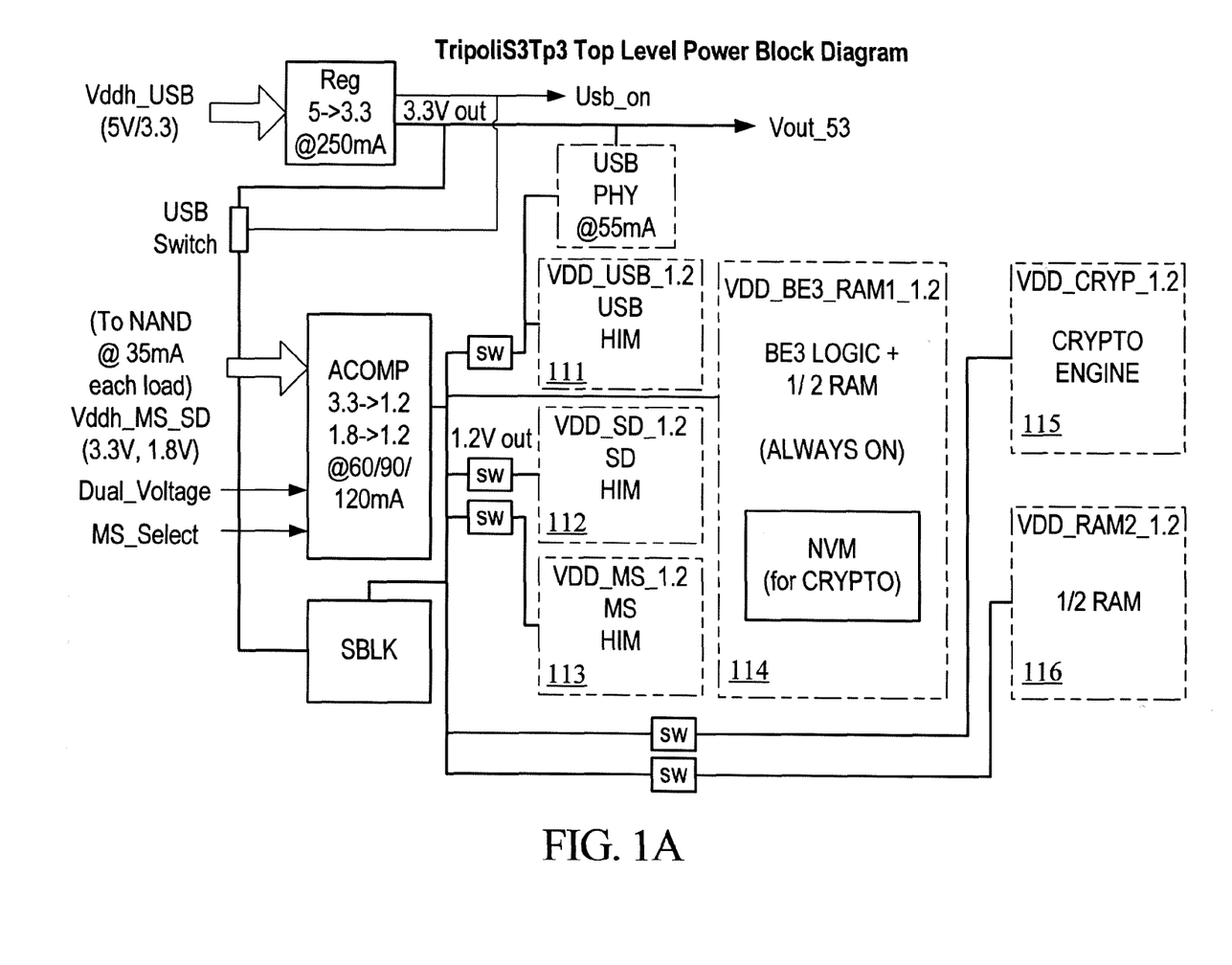
FIG. 1A shows a power block diagram of an integrated circuit which advantageously includes the connection modes of FIG. 1.

FIG. 1A shows a diagram of an integrated circuit which advantageously includes the components of FIG. 1, and FIGS. 1B-1, 1B-2 and 1B-3 together show a power island diagram of the integrated circuit of FIG. 1A.

The exemplary embodiment of FIG. 1A is a multifunction flash memory controller that offers three different external interfaces. Notable features of this embodiment (which are not necessary to the claimed inventions) include:

Secure Flash memory controller Back-End with provisions for data transfer over three Host interfaces SD/MMC (Secure Digital/Multimedia Card) 112, USB (Universal Serial Bus) 111, and MS (Memory Stick) 113, though only one host interface is used at a time.

Partitioning into six voltage islands SD/MMC HIM (Host Interface Module) 112, USB HIM 111, MS HIM 113, Always ON (Back End, MRAM (Main Random Access Memory), Pad control, and Power Management) 114, ORAM (Overlay Random Access Memory) 116, and Crypto Engine 115.

No power consumption overhead, standby or active, from the logic in two powered-down Host interfaces. The power islands with the powered down host interfaces, or OFF Islands, are isolated from power voltage supply (VCC) and ground (GND) by switches so no current can flow.

The power islands with ORAM 116 and Crypto Engine 115 are switched ON or OFF using switches.

Partial-chip power-down functionality can be achieved with controlled analog power switches for each island (except Always ON), and isolation gates can be used to prevent invalid signals from powered-down islands from reaching inputs of the powered-on islands.

Dynamic island control can power-down ORAM 116 and Crypto Engine 115 modules during standby to achieve spec requirements for standby current (SD/MMC represents minimum spec).

Register control of analog block standby-power reduction includes regulator and oscillator standby/disable/low-power modes.

Top-level logic detects and configures a single Host interface to the Back-end, and to power down the remaining two Host interface voltage islands. Detection result register is available to FIRMWARE boot ROM.

Preferably, dynamically controlled individual power islands (e.g., Crypto Engine 115 and ORAM 116) each include their own POR circuits detecting whether power to that island is valid. These can be implanted within the power islands and may encompass multiple PORs to ensure fully valid power throughput the power island. The chip must regulate the host power supply to provide a core voltage of 1.2V for internal logic. In SD, MMC, or MS operational modes, the host provides a 3.3V or 1.8V supply. In many embodiments, a portion of the current supplies the input/output (I/O) pads on the chip (VDDH, etc.) and any external memory, while the remainder is regulated by an internal core regulator to provide a 1.2V supply to the core logic on the chip.

In the exemplary chip depicted for USB, an additional regulation step is required before the core regulator. The USB Host (i.e. VDDH USB) provides a 5V supply to 5-3.3 Regulator (REG), which is regulated to 3.3V then provided to the internal core regulator referred to above, and in USB mode, the 3.3V output of the 5-3.3 Regulator (i.e., VOUT) which is provided to USB PHY (physical layer). When no 5V VDDH USB is present, the power bus is switched using a switch (SW) to isolate the USB PHY and USB HIM modules.

The Analog Component Interface (ACOMP) controls the switching to select USB mode to configure the power routing for USB mode when 5V power (e.g., 3.3 volts) is detected on the USB host interface. The ACOMP can possess a POR and the generated logic can play a critical role in determining when the USB power supply is considered stable, and thus when USB switching occurs to power up the USB HIM. The ACOMP also detects the VDDH MS SD 3.3 or 1.8 V supply voltage to configure for MS or SD mode operation, controlling the USB Switch and switches. The ACOMP also supports dual voltage power of 3.3V or 1.8V based on a Dual Voltage logic input. The ACOMP logic configures for either SD or MS mode when appropriate 3.3V or 1.8V is detected based on the MS Select logic input. The SBLK logic module provides auxiliary functions to the Crypto Engine 114.

The on-chip power supply detection can automatically detect if the USB supply is being used. If so, it routes the USB host power to the appropriate internal regulators and logic blocks. If instead, the chip is operating in SD/MS modes, the switch will block the supply from flowing back into the USB and only power to be routed to the appropriate regulator and logic blocks used by SD/MS modes occurs.

When the USB host supply is active, this is detected by an (inverter) comparator which then turns on the unidirectional power switch so that the 3.3V supply produced by the 5-3.3V regulator can be routed to another regulator which can be used to generate the 1.2V supply needed for core logic. In addition, the output indicator 'usb_on' will be asserted and the correct host interface logic for USB operation will be selected. If however, the chip is not receiving power from its USB power port but from its SD/MS port, then the (inverter) comparator will turn off the switch and only let the SD/MS supply be used to generate the 1.2V needed by the SD/MS core interface logic.

A POR circuit can be implemented that detects the 3.3V or 1.8V source and operate accordingly. Although the core logic would only receive the regulated 1.2V power, a POR can be configured to detect the 3.3V or 1.8V supply to reset the chip island till the appropriate voltage is reached. This may be needed to prevent the circuit from attempting to operate based on a 1.8V supply when the supply voltage is actually 3.3V.

Power Islands

The exemplary embodiment of FIGS. 1B-1, 1B-2 and 1B-3 together are an integrated circuit implementation of power islands as seen in FIG. 1A. Voltage islands refer to sections of the chip electronically coupled for selective powering on/off independently from other areas of the chip to minimize the total power usage during non-operation, standby, or test modes. The architectural goal implements voltage islands for blocks that can be most cleanly shut-off. Five blocks are identified as power islands: USB HIM 111, SD HIM 112, MS HIM 113, Crypto Engine 115 and ORAM 116. All remaining logic including the remaining system RAM, analog modules (ACOMP) 121 and 122, and main logic are always on. Fewer or additional blocks are possible.

Static HIM Selection

Figure 1B:
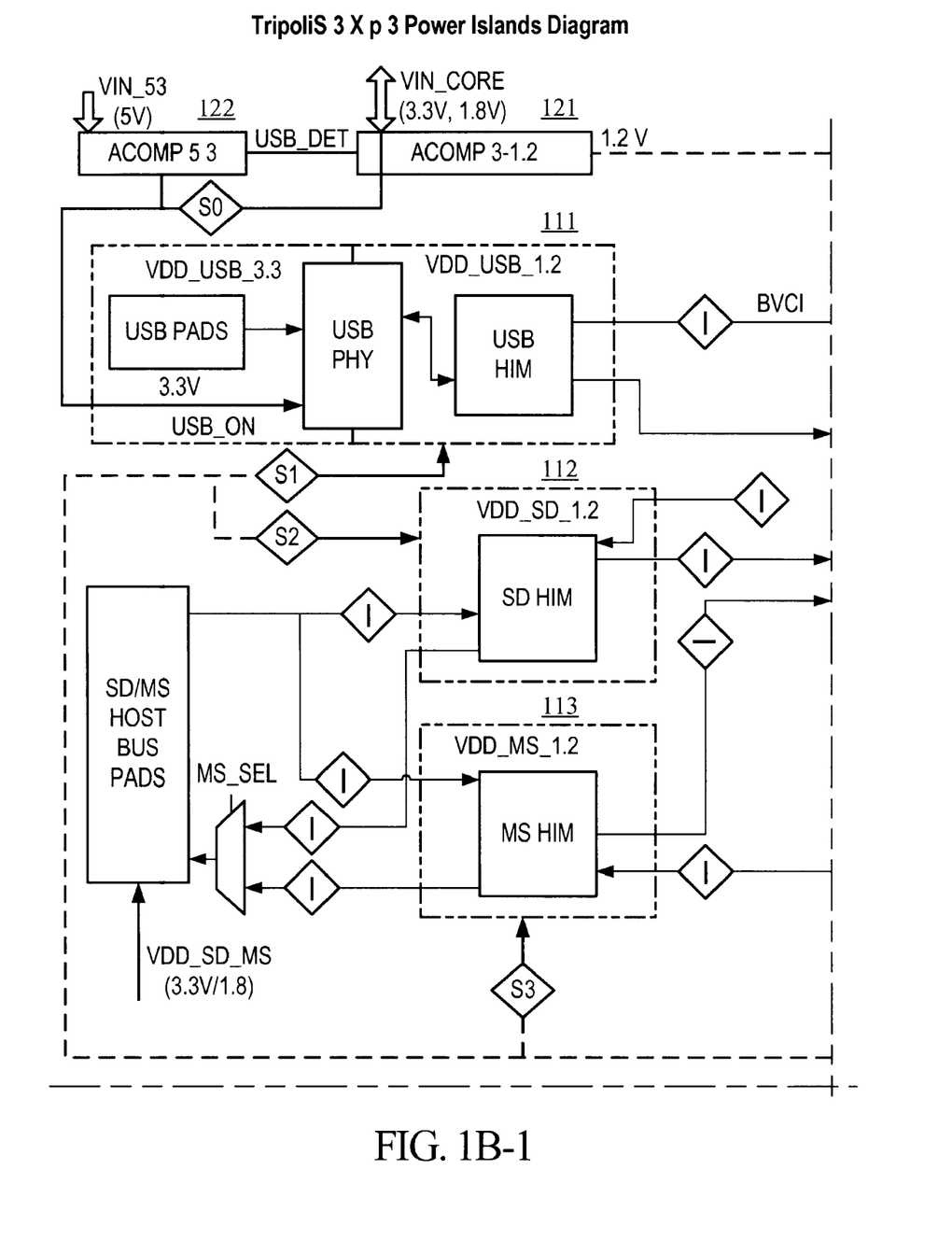
Figure 1B:
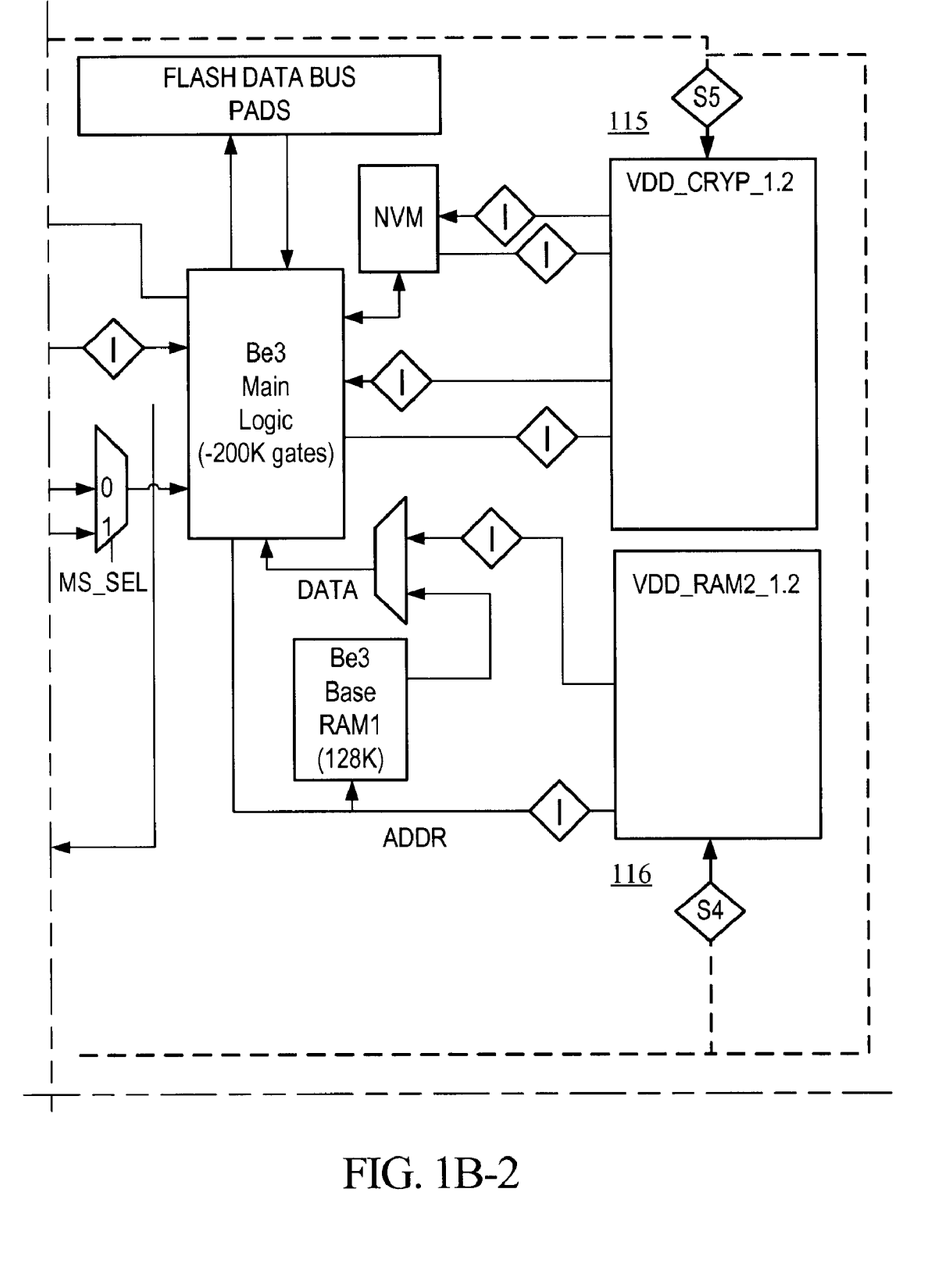
Figure 1B:
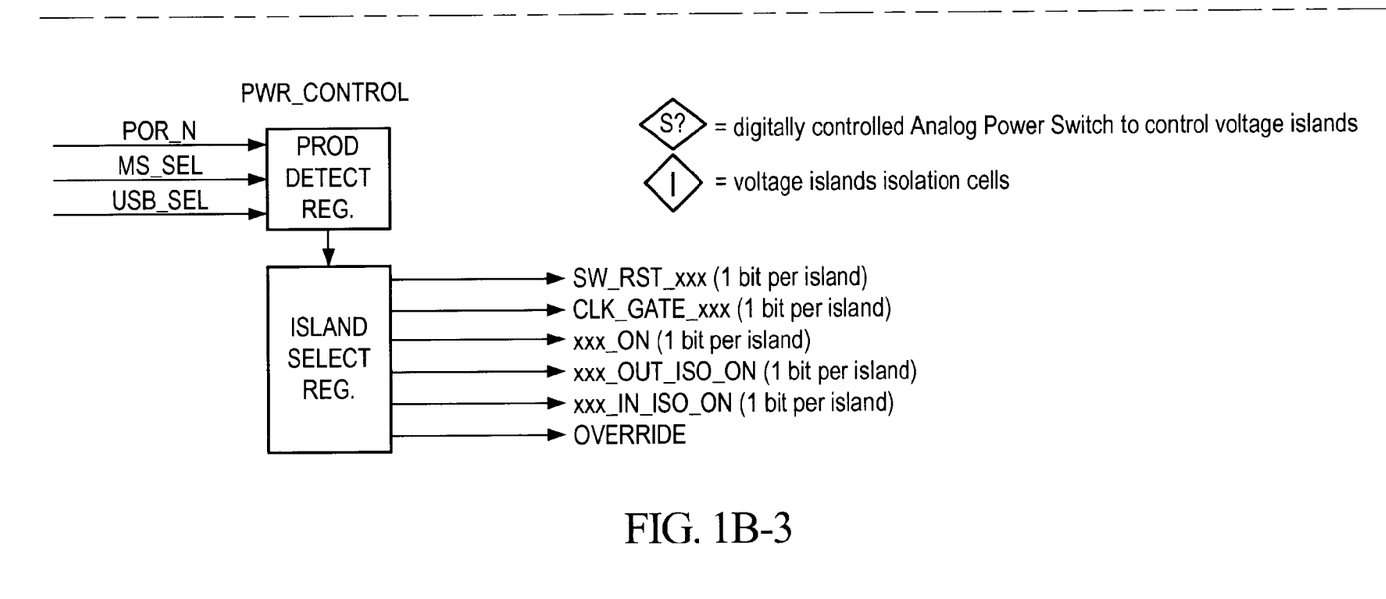

Three power island blocks 111, 112 and 113 represent three different host interfaces. They are implemented as static power islands in the sample embodiment such that only one HIM is active at a time in the design. For example, the entire USB HIM 111 and MS HIM 113 could be statically (permanently) powered down at FW Boot time for an SD product configuration. In such a situation, there is no need to offer dynamic switching among these three HIMs, therefore, the design can implement a static HIM configuration at power-on, and upon de-assertion of POR, only one selected HIM shall be permanently configured until the next full power cycle. In any event, POR can be implemented in all of the HIM power islands.

In an exemplary embodiment, the HIM island control can be handled automatically in hardware. From the firmware standpoint, after power-up, the static island configuration is complete, and the product has become one of the three controller types (SD/NMC or MS or USB).

By the time the CPU comes out of its POR, and firmware (ROM) is executing, the correct host interface is available (its island is powered on), and firmware reads the HIM ID register, and begins executing the appropriate code for that interface. A Power Island Control Register in the CPU (not shown) determines which power switches are opened to supply the 1.2V core voltage to the named islands.

Note that in this exemplary embodiment, the BE 3 Main Logic island must be ON for the CPU to be powered, thus enabling firmware (ROM) in the CPU to boot the system. This bit is considered reserved because the BE 3 Main Logic island includes all the Power Island Control logic and is always on, and cannot be shut-off through this register or otherwise. Other embodiments may support power-down of the BE Main Logic island with the always on power island control being separated out.

70/90/130 nm vs. 55 nm NAND Memory for SIP

Figure 2A:
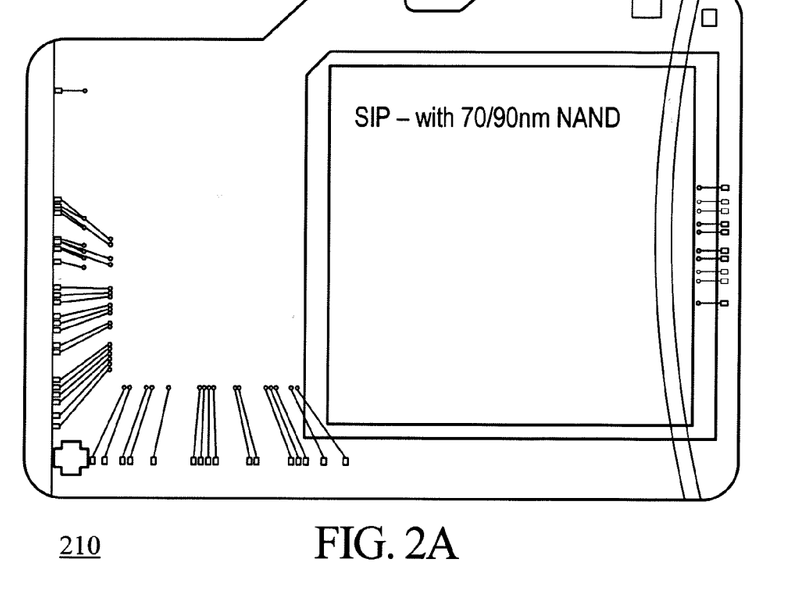
FIG. 2a shows a sample embodiment of memory using the bond pads along the short edge of the flash memory die.

FIG. 2a shows a sample embodiment of memory utilized bond pads along the short edge of the flash memory die 210, where the controller could be bonded in the lower left corner. Note that in this type of bond pads all bond wires are approximately the same length. It is supported by the Tripoli-controller, 70/90 nm NAND memory, referenced by 210.

Figure 2B:
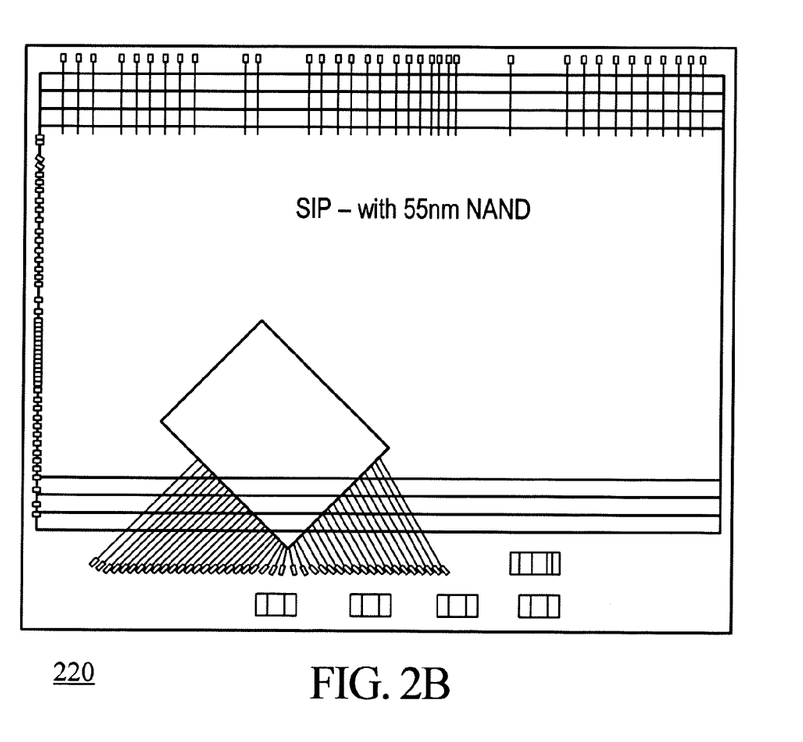
FIG. 2b shows another sample embodiment of flash memory module, in which the chip controller is at an angle with the memory die.

FIG. 2b shows another sample embodiment of flash memory to be supported by the Tripoli-controller, 55 nm NAND memory, as referenced by 220. This embodiment changed the design to utilize bond pads along the long edge of the die. As a consequence of this, the lower-left corner bonding was no longer possible. A ~45-degree angled controller arrangement was developed to accommodate this. This new orientation now requires unequal bond wire lengths, with the shortest in the extreme lower left corner of the "L" on the controller, and progressively longer wires moving to the bottom right or upper left side of the pad arrangement as shown.

Figure 3:
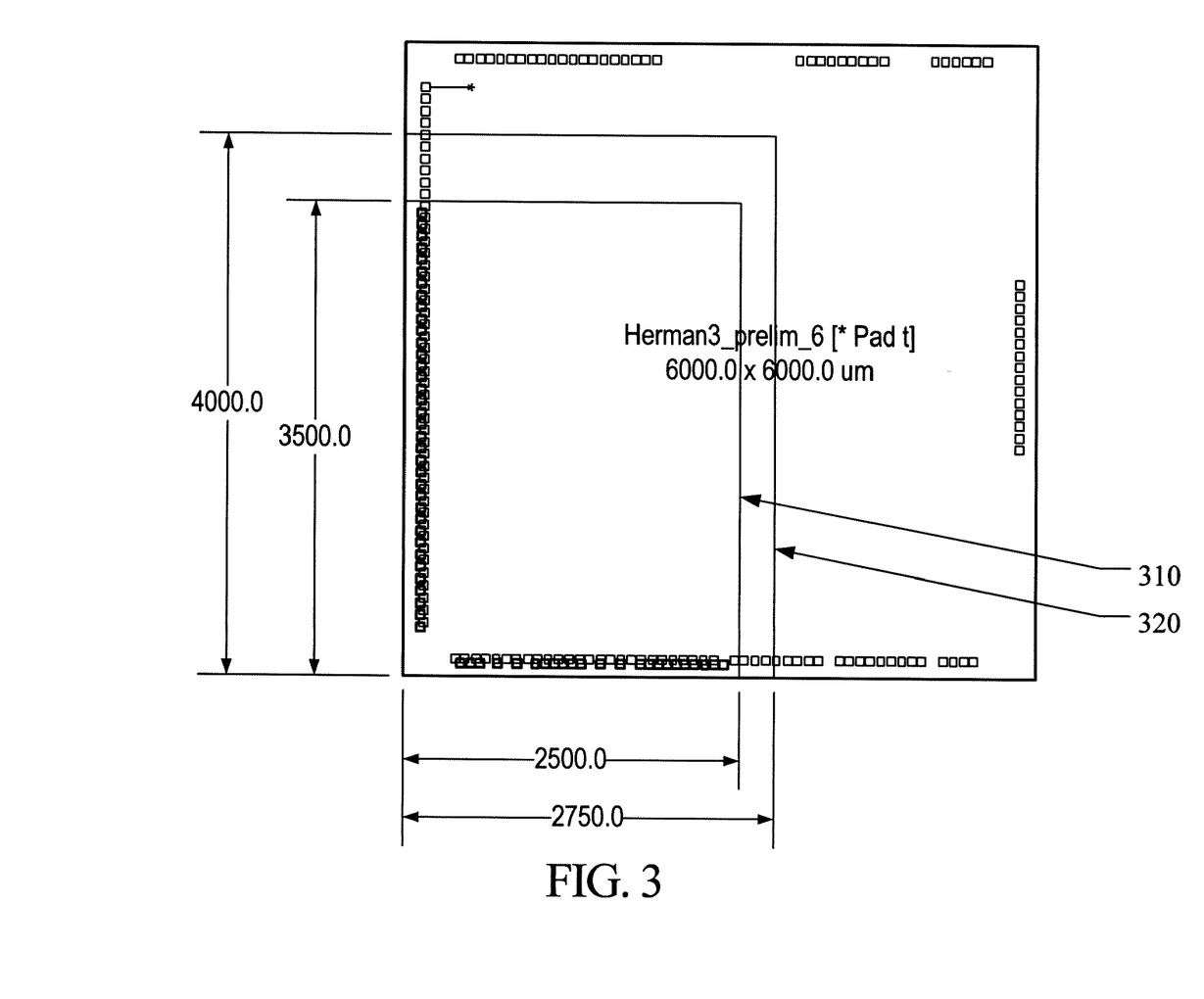
FIG. 3 illustrates the earlier prior art die-size with the lower-left L-shaped pad span for SIP bonding (internal inlay) and the larger die-size using the inventions and projected pad-span.

FIG. 3 illustrates the earlier prior art die-size 310 and the lower-left L-shaped pad span for SIP bonding (internal inlay) and Tripoli die-size (larger) and projected pad-span 320. An allowable SIP bonding envelop is increased from the prior art embodiment 310 (3.5×2.5 mm) to (4.0×2.75 mm) for Tripoli 320. Not all of the pads of the left and bottom-sides are required for the SIP (SD/MMC/MS) package—some of these would be needed only for USB products, which utilize QFP packaging only and not SIP.

Functional PAD Groups

FIG. 5 shows an embodiment for the Tripoli chip I/O pads. The following is a brief description of the major functional pad groups:

| | |
|---|---|
| JTAG | External test port for testing and FW debug |
| FD Bus | Flash Data Bus (16-bit or 8-bit) |
| SD/MMC/MS Host Bus | Secure Digital, Multi-Media Card, or Memory Stick Host Interface Bus (pads Muxed/shared by 3 interfaces) |
| VREG_CORE - Bond wire lengths in SIP * | Core 1.2 V Regulator (from 3.3 V or 1.8 V Host Supply) |
| VREG_53 | USB 3.3 V Regulator (from 5 V USB Host Supply) |
| USB PHY | USB 2.0 PHY Interface |
| DUP FD Bus (DUP_SEL) | Duplicate (portion of) Flash Data Bus (16-bit or 8-bit, for non-SIP packages) |
| OSC1, OSC2 Hook-ups | USB external Crystal Oscillator (OSC1 default, OSC2 backup for Risk mitigation) |
| Serial (ISO7816, SPI, I2C), Extra I7816_CK2 - Metal strip | Serial Buses: ISO7816 for SD only (2_CK pins for 70, 55 nm Memory), SPI & I2C for USB only |
| NVM TM pads | NVM (non-volatile memory) test port |

Figure 4:
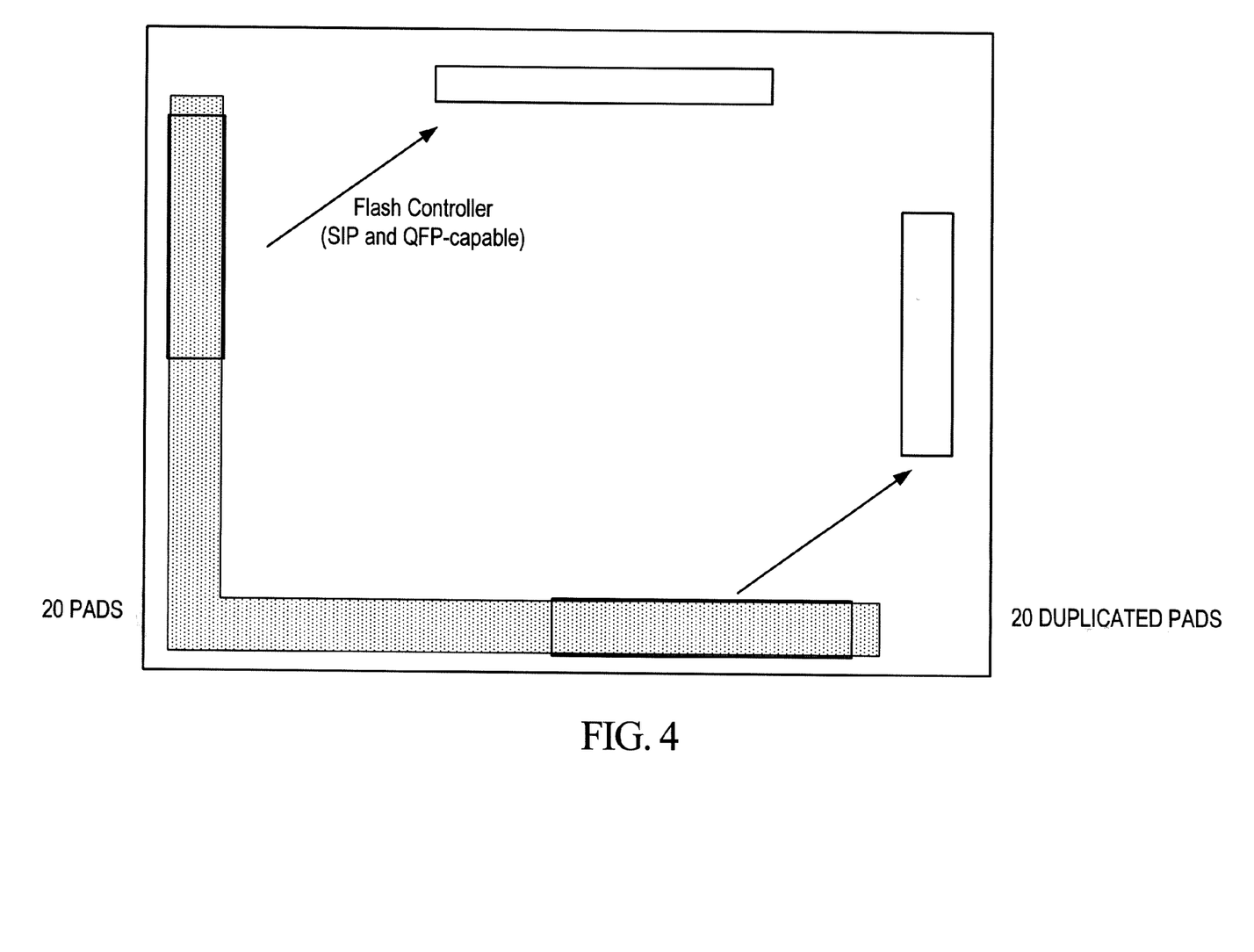
FIG. 4 shows a simple illustration of electrically-selectable pad duplication.

The sample embodiment configures a single-die Pad Ring to offer SD, MMC, MS, USB and SD+ mode options by arranging the pad groups to support multiple bonding/packaging options for various supported optionss. Product and pad group selection was controlled based on Host Power detection as described in the Power Island sections above. FIG. 4 shows a full bonding drawing embodiment.

All additional USB pads (PHY and Misc. I/Os) are located on top and right-hand sides. Half of the left-side FD pad groups (B and D) are duplicated on the top side to support the low-cost 80 TQFP package. The industry-standard JTAG test interface is provided near the top of the left side of the controller.

Thus, the Pad Ring arrangement supports SIP (system-in-Package) and 48 BGA for SD/MMC and MS, 80TQFP for USB, and 81VFBGA for SD+ products.

Packaging and Test Support

The Tripoli chip provides control logic to configure pad ring for several product packaging configurations and test modes.

Multi-HIM Interface to Back-End

The Tripoli chip offers 3 Die-level selectable HIM interfaces (Front-ends) connected to a single Back-end. The BVCI port to the BMU is dedicated to the USB device controller. The HDMA interfaces of the SD/MMC HIM and the MS HIM must be Muxed into a single HDMA port in the BMU.

Tripoli implements a static HIM configuration at Power-on, and upon de-assertion of POR (Power-on Reset), only one selected HIM can be permanently configured until the next full power cycle. The SD+ operation configuration in particular provides an SD interface and a USB interface on each end of the supported device, but plugging both ends into interfaces at the same time is not supported. The capability of three product-configurable HIMs on a single die offers significant supply-chain flexibility. This Tripoli chip exhibits a "3 capabilities-1-die" design goal to always meet all 3 sets of requirements to function in the multiple modes.

Power Islands

Unused portions of the logic can be completely powered down such that there is no leakage contribution from those blocks in standby/sleep mode. Powering-down logic or RAM causes loss of State, and powering-up after standby is subject to performance requirements—Host response time, code re-loading, etc. The Power Island Strategy considerations include:

1) Only one HIM at a time is active in design; and the Crypto module is an independent co-processor engine, which can be powered down with almost no state preservation.
2) A portion of total RAM can be powered-down. Firmware can place "resume from standby" code in the remaining "Always ON" memory to meet host response time. At power-up of this block, Firmware can stream refill the powered-down RAM, which reduces the performance hit.
3) The Tripoli Power Island implementation consists of both Static and Dynamic Island control, but no Dynamic Frequency or Voltage scaling.

Island Control Mechanisms

Once the logic and RAM have been logically partitioned into discrete islands, several mechanisms must be added to control the islands and enable standby power savings under the necessary product configurations and conditions:

System Core power gating and control (Host supply regulation and Analog power isolation switches)
Product package detection (SD/MMC, USB, or MS product configurations)
Static Island configuration (enable one HIM, disable other two)
Dynamic Island control and status (CRYPTO, ORAM power-up, power-down sequence timing)=>also provides over-ride of HIM control for Test
Logic Gate Isolation Control (ON-Island isolation from OFF-island(s) effects)

Packaging

The multi-chip module (SIP) is most cost-effective for SD/MMC, MS. However, QFP packaging is required for USB. This packaging is low-cost, and allows use of non-captive, packaged NAND supply.

According to various disclosed embodiments there is provided: An integrated circuit comprising: a first set of bond pads along two edges of the integrated circuit; and a second set of bond pads along a third edge of the integrated circuit; wherein said first set of bond pads provides all necessary connections for a complete operative packaged integrated circuit; and wherein ones of said second set of bond pads provide selectable functional duplicates for respective corresponding ones of said first set of bond pads.

According to various disclosed embodiments there is provided: An integrated circuit comprising: a first set of bond pads along two adjacent edges of the integrated circuit; and a second set of bond pads along at least a third edge of the integrated circuit; wherein said first set of bond pads provides all necessary connections for a complete packaged integrated circuit, which is fully operative in a first mode of operation; and wherein some ones of said second set of bond pads provide selectable functional duplicates for respective corresponding ones of said first set of bond pads, and other ones of said second set of bond pads also provide additional connections which are not necessary for said first mode of operation, but are necessary for a second mode of operation.

According to various disclosed embodiments there is provided: An integrated circuit, comprising: control circuitry which is configurable to operate in at least first and second modes; a first set of bond pads along two adjacent edges of the integrated circuit; and a second set of bond pads along at least a third edge of the integrated circuit; wherein said first set of bond pads provides all necessary external signal connections for said first mode of operation, but not for said second mode; and wherein said some ones of said second set of bond pads provide selectable functional duplicates for respective corresponding ones of said first set of bond pads, and said first and second sets of bond pads in combination provide all necessary external signal connections for said second mode of operation.

According to various disclosed embodiments there is provided: An integrated circuit comprising: a first set of bond pads along two edges of the integrated circuit; and a second set of bond pads along two other edges of the integrated circuit; wherein at least some ones of said second set of pads are electrically duplicated by respective ones of said first set of pads; and wherein more than one-sixth but fewer than two-thirds of said first set of pads are electrically duplicated by ones of said second set of pads.

According to various disclosed embodiments there is provided: An integrated circuit comprising: a plurality of circuits integrated in a single die; a first set of bond pads along first and second adjacent edges of said die; and a second set of bond pads along at least a third edge of the integrated circuit; and wherein some ones of said second set of bond pads provide electrically selectable functional duplicates of respective corresponding ones of said first set of bond pads; and wherein said first and second edges, but not said third edge, are densely packed with operative or selectably operative ones of said pads.

According to various disclosed embodiments there is provided: An integrated memory controller circuit, comprising: memory control circuitry which is selectably configurable to operate, when connected to a memory chip, in either of at least first and second mutually incompatible input/output modes; a first set of bond pads, positioned along no more than two edges of the integrated circuit, which provides all necessary external signal connections for said first mode of operation, but not for said second mode; and a second set of bond pads, positioned along third and fourth edges of the integrated circuit, which includes additional external signal connections required for said second mode of operation, and also at least some pads which are electrically selectable functional duplicates of respective corresponding ones of said first set of bond pads; whereby the controller chip can be packaged either in a stacked configuration with a memory chip, and connected, using only said first set of bond pads, to operate in said first mode, or in a standalone package using both said sets of bond pads for external connection.

According to various disclosed embodiments there is provided: An integrated memory controller circuit, comprising: control circuitry which is electrically configurable to operate, when connected to a memory chip, in either of at least first and second mutually incompatible input/output modes; a first set of bond pads, positioned along two adjacent edges of the integrated circuit, which provides connections to a local memory data bus, and also all necessary external signal connections for said first mode of operation, but not for said second mode; and a second set of bond pads, positioned along third and fourth edges of the integrated circuit, which includes additional external signal connections required for said second mode of operation; whereby the controller chip can be packaged either in a stacked configuration with a memory chip, and connected, using only said first set of bond pads, to operate in said first mode, or in a standalone package using both said sets of bond pads for external connection.

According to various disclosed embodiments there is provided: An integrated memory controller circuit, comprising: control circuitry which is selectably configurable to operate, when connected to a memory chip, in either of at least first and second mutually incompatible input/output modes; said control circuitry having connections, at a first edge of a die, to a local memory data bus; said control circuitry also having input/output connections, at a second edge of said die, for said first input/output mode; said control circuitry also having input/output connections, at a third edge of said die, for said second input/output mode; and duplicated data connections, on a fourth edge of said die, which are electrically selectable to replicate ones of said connections from said first edge.

According to various disclosed embodiments there is provided: A rectangular integrated circuit die comprising: a first set of bond pads along two adjacent edges of the die; and a second set of bond pads along two other edges of the die; wherein more than one-sixth of said second set of pads are electrically connected to duplicate respective ones of said first set of pads, subject to power control logic which prevents most duplicate pads from both being electrically driven; and wherein more than one-sixth of said first set of pads are electrically connected to ones of said second set of pads.

According to various disclosed embodiments there is provided: A method of fabricating integrated circuits, comprising the actions of: fabricating circuitry in the core of a die; fabricating I/O interface circuits which are connected to pads along the edges of said die, at least some pairs of said pads including electrically selectable duplicates on different edges of said die; fabricating power control circuitry which applies power to no more than one pad of any one of said pairs, and holds the other pad of a pair in a minimum-power condition.

According to various disclosed embodiments there is provided: A method of packaging an integrated circuit, comprising the actions of: assembling a controller chip to a memory chip; said controller chip being electrically configurable to operate in either of at least first and second mutually incompatible input/output modes, and including a first set of bond pads, positioned along two edges of the controller chip, which provides connections to a local memory data bus, and also all necessary external signal connections for said first mode of operation, but not for said second mode; and a second set of bond pads, positioned along third and fourth edges of the integrated circuit, which includes additional external signal connections required for said second mode of operation; connecting said first set of bond pads to said memory chip through a local bus connection, so that said controller can operate in said first mode but not in said second mode; and packaging said memory chip and said controller chip together.

According to various disclosed embodiments there is provided: A method of operating a multi-chip memory module which contains a single controller chip and at least one memory chip, comprising the actions of: detecting, in said controller chip, externally applied voltages at external connections of said controller chip; quasi-statically configuring said controller chip, in dependence on said externally applied voltages, to operate in either of at least first and second mutually incompatible input/output modes, and if said controller chip is operating in said first mode, then interfacing solely through a first set of bond pads, positioned along two edges of said controller chip; and If said controller chip is operating in said second mode, then interfacing both through a first set of bond pads and also through a second set of bond pads which are positioned along third and fourth edges of the controller chip, while disabling drive to some ones of said first set and instead driving duplicate pads in said second set; wherein said controller chip communicates with said memory chip through a local bus connection.

According to various disclosed embodiments there is provided: A method of manufacturing memory modules, comprising the actions of: obtaining, in dependence on available supplies, either packaged or unpackaged memory chips of a given size; integrating said memory chips with multi-package-compatible memory controller chips, either in a stacked chip configuration which includes an integrated memory databus local interconnects if said memory chips are unpackaged, or in a module configuration if said memory chips are packaged; and electrically configuring said memory controller chip to enable and statically disable duplicated pads thereof, in dependence on which configuration is used in said integrating step.

A particular advantage of this class of embodiments, though not the only one, is a net improvement in the utilization of total wafer area.

According to various disclosed embodiments there is provided: A memory module, comprising: a memory controller die; a memory chip; a local data bus connecting multiple data terminals of said controller die to respective corresponding terminals of said memory chip; and external terminals which are connected to respective corresponding terminals of said controller die; wherein said controller die has multiple selectable duplicates of at least some of said data terminals, and power selection between said data terminals and said duplicates thereof is mutually exclusive;

According to various disclosed embodiments there is provided: A memory module, comprising: a memory controller die; a memory chip; a local data bus connecting multiple data terminals of said controller die to respective corresponding terminals of said memory chip; and external terminals which are connected to respective corresponding terminals of said controller die; wherein said controller die has multiple selectable duplicates of at least some of said data terminals, and power selection between said data terminals and said duplicates thereof is mutually exclusive; and wherein said controller die automatically switches interface modes, in dependence on voltages seen at said external terminals.

Modifications and Variations

As will be recognized by those skilled in the art, the innovative concepts described in the present application can be modified and varied over a tremendous range of applications, and accordingly the scope of patented subject matter is not limited by any of the specific exemplary teachings given. It is intended to embrace all such alternatives, modifications and variations that fall within the spirit and broad scope of the appended claims.

According to some of the innovative teachings here, the pads which are not used for the selected package configuration are preferably held in a lowest-power-consumption state. However, some others of the disclosed ideas do not require this. In alternative embodiments, it is not necessary to put every bypassed pad into its lowest-power state. Excess power consumption will be proportional to the number of pads which are driven unnecessarily, but depending on design requirements or design errors this excess power consumption may be tolerable.

One way to put a pad into a low power state is to locate its drivers in a "pad domain" which is totally powered off and isolated for pads which are unused. In alternative embodiments, power can be reduced in other ways, e.g. by putting the replicated pads in input mode, and possibly tying them to a fixed low voltage.

Of course, the number and specific assignment of pads in the sample embodiments disclosed above is merely illustrative, and the disclosed inventions provide general concepts which are applicable to a very wide range of specific pad configurations. In various alternative embodiments, more or fewer pads can be used, different pad assignments can be used, and different module and system configurations can be used.

For another example, although the primary application discussed is a memory controller which can (in some embodiments) be applied to a system-in-package, it should be recognized that other applications are also possible. The disclosed inventions provide a general design technique which can be applied to other multi-package-compatible chips, and particularly to integrated circuits which are compatible both with discrete packaging and also with system-in-package designs.

The external connections to an integrated circuit die are generally referred to herein as "bond pads," in accordance with current consumer-market technology, but other technologies can be substituted if needed, e.g. bump bonding, through-chip, or via structures.

Reference is also made to the following commonly owned and copending U.S. Patent Applications, each and every one of which is hereby incorporated by reference in its entirety: 60/934,936 filed Dec. 31, 2006; 60/921,507 filed Dec. 31, 2006; 60/934,918 filed Dec. 31, 2006; 60/934,917 filed Dec. 31, 2006; 60/999,760 filed Dec. 31, 2006; 60/934,923 filed Dec. 31, 2006; 60/934,937 filed Jan. 1, 2007; 60/921,508 filed Jan. 1, 2007; Ser. No. 11/618,849 filed Dec. 31, 2006; Ser. No. 11/618,852 filed Dec. 31, 2006; Ser. No. 11/618,865 filed Dec. 31, 2006; Ser. No. 11/618,867 filed Dec. 31, 2006; Ser. No. 11/649,325 filed Dec. 31, 2006; Ser. No. 11/649,326 filed Dec. 31, 2006; Ser. No. 11/965,943 filed Dec. 28, 2007 ("Systems and Circuits with Multirange and Localized Detection of Valid Power"); and Ser. No. 11/967,382 filed Dec. 28, 2007 ("Exclusive-Option Chips and Methods with All-Options-Active Test Mode"). None of these applications are necessarily related to the present application, but these help to show features which were designed into the same system as the ideas described above, and/or which combine synergistically with those ideas.

None of the description in the present application should be read as implying that any particular element, step, or function is an essential element which must be included in the claim scope: THE SCOPE OF PATENTED SUBJECT MATTER IS DEFINED ONLY BY THE ALLOWED CLAIMS. Moreover, none of these claims are intended to invoke paragraph six of 35 USC section 112 unless the exact words "means for" are followed by a participle.

The claims as filed are intended to be as comprehensive as possible, and NO subject matter is intentionally relinquished, dedicated, or abandoned.

What is claimed is:

1. An integrated circuit comprising:
a first set of bond pads along two edges of the integrated circuit; and
a second set of bond pads along a third edge of the integrated circuit;
wherein said first set of bond pads comprises a complete set of connections for at least a first mode of operation of a complete operative packaged integrated circuit;
and wherein ones of said second set of bond pads comprise electrically selectable functional duplicates for respective corresponding ones of said first set of bond pads.

2. The integrated circuit of claim 1, wherein said second set of bond pads also extends along a fourth edge which is adjacent to said third edge.

3. The integrated circuit of claim 1, wherein said first set of bond pads includes power connections.

4. The integrated circuit of claim 1, wherein said first set of bond pads comprises a complete set of connections for some modes of operation of said integrated circuit, but not for all modes of operation of said integrated circuit.

5. The integrated circuit of claim 1, wherein ones of said second set of bond pads comprise electrically selectable functional duplicates for some respective corresponding ones of said first set of bond pads, but not for other ones of said first set of bond pads.

6. The integrated circuit of claim 1, wherein at least some of said first set of bond pads are integrated with input/output devices which are powered off when respective functional duplicates in said second set of bond pads of said some of said first set of bond pads are active.

7. The integrated circuit of claim 1, wherein ones of said second set of bond pads comprise electrically selectable functional duplicates for respective corresponding ones of said first set of bond pads.

8. The integrated circuit of claim 1, wherein said first mode includes a USB external interface.

9. The integrated circuit of claim 1, wherein said first set of bond pads includes all connections for a local memory data bus, and more than one-third of said connections for said local memory data bus are replicated in said second set of bond pads.

10. An integrated circuit comprising:
a first set of bond pads along two adjacent edges of the integrated circuit; and a second set of bond pads along at least a third edge of the integrated circuit;

wherein said first set of bond pads comprises a complete set of connections for implementing a first mode of operation in a complete packaged integrated circuit;

and wherein ones of said second set of bond pads comprise selectable functional duplicates for respective corresponding ones of said first set of bond pads, and other ones of said second set of bond pads also provide additional connections which are not necessary for said first mode of operation, but are necessary for a second mode of operation.

11. The integrated circuit of claim 10, wherein some of said first set of bond pads are not duplicated in said second set of bond pads.

12. The integrated circuit of claim 10, wherein said first set of bond pads comprises less than a complete set of connections for a complete packaged integrated circuit which is fully operative in said second mode of operation.

13. The integrated circuit of claim 10, wherein said second set of bond pads also extends along a fourth edge which is adjacent to said third edge.

14. The integrated circuit of claim 10, wherein said first set of bond pads includes power connections.

15. The integrated circuit of claim 10, wherein said first set of bond pads comprises a complete set of connections for some modes of operation of said integrated circuit, but not for all modes of operation of said integrated circuit.

16. The integrated circuit of claim 10, wherein ones of said second set of bond pads provide selectable functional duplicates for some respective corresponding ones of said first set of bond pads, but not for other ones of said first set of bond pads.

17. The integrated circuit of claim 10, wherein at least some of said first set of bond pads are powered off in said second mode, and at least some of said second set of bond pads are powered off in said first mode.

18. The integrated circuit of claim 10, wherein said first mode includes a USB external interface.

19. The integrated circuit of claim 10, wherein said first set of bond pads includes all connections for a local memory data bus, and more than one-third of said connections for said local memory data bus are replicated in said second set of bond pads.

20. The integrated circuit of claim 10, wherein said first set of bond pads includes all connections for a local memory data bus, and a portion of said connections for said local memory data bus are replicated in said second set of bond pads.

* * * * *